(12) United States Patent
Bachman et al.

(10) Patent No.: US 7,479,695 B2
(45) Date of Patent: Jan. 20, 2009

(54) LOW THERMAL RESISTANCE ASSEMBLY FOR FLIP CHIP APPLICATIONS

(75) Inventors: Mark Adam Bachman, Sinking Spring, PA (US); David L. Crouthamel, Bethlehem, PA (US)

(73) Assignee: Agere Systems Inc., Allentown, PA (US)

( * ) Notice: Subject to any disclaimer, the term of this patent is extended or adjusted under 35 U.S.C. 154(b) by 295 days.

(21) Appl. No.: 11/375,302

(22) Filed: Mar. 14, 2006

(65) Prior Publication Data

US 2007/0216034 A1    Sep. 20, 2007

(51) Int. Cl.
H01L 23/34    (2006.01)
(52) U.S. Cl. .................. 257/713; 257/720
(58) Field of Classification Search ........ 257/713, 257/720
See application file for complete search history.

(56) References Cited

U.S. PATENT DOCUMENTS 5,766,740 A * 6/1998 Olson .................... 428/209
7,136,274 B2 * 11/2006 Hwang et al. ........... 361/306.3
2003/0214049 A1 11/2003 Hortaleza et al.
2004/0212102 A1 10/2004 Akram et al.
2005/0104222 A1 5/2005 Jeong et al.
2005/0245060 A1 * 11/2005 Chiu ..................... 438/612
2006/0208365 A1 * 9/2006 Shen et al. ............. 257/778

* cited by examiner

Primary Examiner—Trung Dang
(74) Attorney, Agent, or Firm—Ryan, Mason & Lewis, LLP

(57) ABSTRACT

An assembly comprises a stiffener, a circuit substrate and an integrated circuit (IC) chip. The stiffener has a surface with a first region and a second region. The circuit substrate covers the first region, while the IC chip overlies at least a portion of each of the first and second regions. Moreover, the assembly further comprises a plurality of first solder bumps and a plurality of second solder bumps. The first solder bumps contact both the IC chip and the circuit substrate. The second solder bumps are larger than the first solder bumps, contact the IC chip and are disposed above the second region of the stiffener.

20 Claims, 3 Drawing Sheets

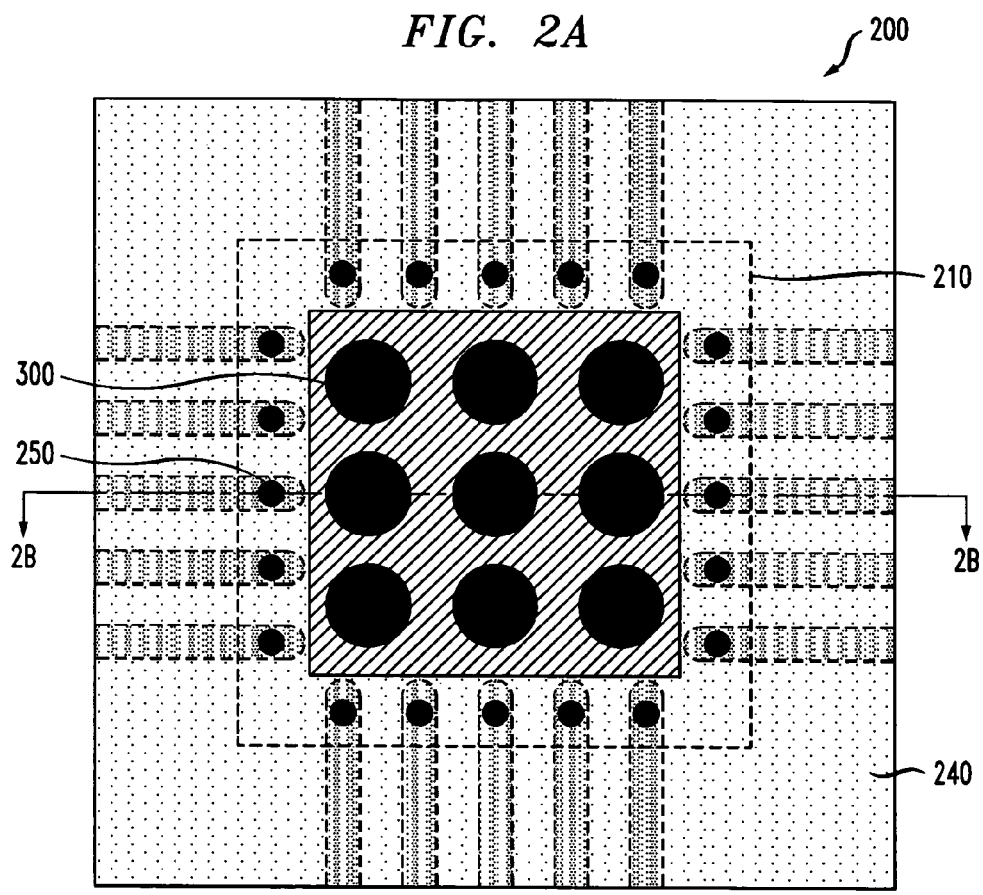
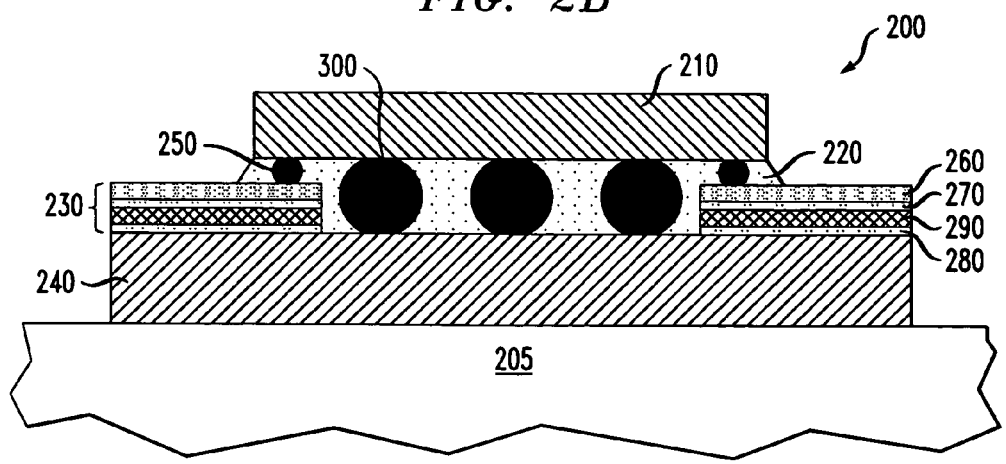

LOW THERMAL RESISTANCE ASSEMBLY FOR FLIP CHIP APPLICATIONS

FIELD OF THE INVENTION

This invention is related to integrated circuit chips, and, more particularly, to flip chips and circuit substrates.

BACKGROUND OF THE INVENTION

Direct chip attachment (DCA) refers to a semiconductor assembly technology wherein an integrated circuit (IC) chip is directly mounted on and electrically connected to its final circuit substrate instead of undergoing traditional assembly and packaging. Advantageously, the elimination of conventional device packaging in DCA both simplifies the manufacturing process and reduces the space that the IC chip occupies on the final circuit substrate. It also improves performance as a result of the shorter interconnection pathways between the IC chip and the circuit substrate.

Flip chips are frequently utilized in DCA applications. A flip chip comprises an IC chip with a multiplicity of solder bumps attached to the chip's bonding pads. During mounting, these solder bumps are directly attached to the circuit substrate. Once attached, the solder bumps serve several functions. Electrically, the solder bumps act to convey signals between the IC chip and circuit substrate. In addition, the solder bumps provide a thermal pathway to carry heat away from the IC chip. The solder bumps also serve to strengthen the mechanical attachment of the IC chip to the circuit substrate. Finally, the solder bumps act to form a space between the IC chip and the circuit substrate, preventing electrical contact between these elements. In the final stages of assembly, this space is usually filled with a nonconductive "underfill." The underfill protects the solder bumps from moisture or other environmental hazards, provides additional mechanical strength to the assembly, and compensates for any thermal expansion differences between the IC chip and the circuit substrate.

In flip-chip-on-flex (FCoF) applications, the circuit substrate is substantially flexible, while in flip-chip-on-board (FCoB) applications, the circuit substrate is substantially rigid. In either case, the surface of the circuit substrate nearest the flip chip typically comprises a plurality of conductive traces, many of which are attached to the solder bumps of the flip chip. These conductive traces are usually supported by an organic material and act to conduct electrical signals between the flip chip and other electronic devices. In contrast, the surface of the circuit substrate opposed to the flip chip is often attached to a metallic stiffener. In those applications where the circuit substrate is flexible, the stiffener prevents the circuit substrate from flexing in the region where it is attached to the flip chip. Moreover, the stiffener is generally attached to a support structure that acts as a heat sink to dissipate heat generated by the flip chip.

Since the stiffener is typically attached to the support structure, increasing the rate of heat flow to the stiffener acts to increase the overall rate of heat dissipation from the flip chip. In a typical assembly comprising a flip chip, circuit substrate and stiffener, it is the solder bumps, underfill and circuit substrate that serve to transport the heat generated by the IC chip portion of the flip chip to the stiffener. In many flip chip designs however, solder bumps are only placed along the periphery of the IC chip. Due to both the placement of the solder bumps in these "peripheral I/O" IC chips and their relatively small dimensions, heat dissipation from the IC chip to the stiffener is predominantly through the underfill and the circuit substrate. Unfortunately, the materials forming the underfill and circuit substrate are usually characterized by low thermal conductivities. As a result, these thermal pathways are often inadequate to obtain a desired heat flow. When heat flow from the IC chip portion of the flip chip to the support structure (i.e., heat sink) is inadequate, the IC chip's functions and/or speed must be reduced so that the IC chip does not exceed a temperature at which its lifetime is adversely affected.

Attempts to increase heat flow from the flip chip to the support structure in FCoF and FCoB applications include increasing the density of the conductive traces on the circuit substrate, increasing the thickness of the conductive traces, using higher thermal conductivity materials for the solder bumps, increasing the number of solder bumps and using higher thermal conductivity underfills. Unfortunately, these attempts typically result in only small improvements to the heat flow from the flip chip. Alternatively, an additional metal heat sink may be attached directly to a surface of the flip chip. While effective at increasing the heat flow from the flip chip, this solution results in added cost and may not be possible due to space constraints.

As a result, there is a need for improved flip chip and circuit substrate designs for use in FCoF and FCoB applications that enhance heat dissipation from the flip chip when compared to conventional designs.

SUMMARY OF THE INVENTION

The present invention addresses the above-identified need by providing improved flip chip and circuit substrate designs. Advantageously, embodiments of these designs enhance heat dissipation from the flip chip when compared to conventional designs.

In accordance with an aspect of the invention, an assembly comprises a stiffener, a circuit substrate and an IC chip. The stiffener has a surface with a first region and a second region. The circuit substrate covers the first region, while the IC chip overlies at least a portion of each of the first and second regions. Moreover, the assembly further comprises a plurality of first solder bumps and a plurality of second solder bumps. The first solder bumps contact both the IC chip and the circuit substrate. The second solder bumps are larger than the first solder bumps, contact the IC chip and are disposed above the second region of the stiffener.

In accordance with another aspect of the invention, an apparatus comprises an assembly and a support structure. The assembly is configured like the assembly just described. The support structure is attached to the stiffener and is operative to dissipate heat generated by the IC chip.

In an illustrative embodiment, an assembly comprises a stiffener, a circuit substrate and an IC chip. The circuit substrate is shaped such that it defines an aperture over the stiffener. What is more, the IC chip is attached to several signal solder bumps and several thermal solder bumps. The signal solder bumps serve to electrically and mechanically couple the IC chip to the circuit substrate. The thermal solder bumps, in contrast, are substantially larger than the signal solder bumps and are in physical contact with that region of the stiffener revealed by the aperture in the circuit substrate. The stiffener is metallic and acts to transport heat from the assembly to an attached support structure.

Advantageously, the thermal solder bumps act to create a low thermal resistance pathway for heat flow from the IC chip to the stiffener and the support structure. Cooling of the IC chip is thereby enhanced by using an assembly in accordance with aspects of the invention.

These and other features and advantages of the present invention will become apparent from the following detailed description which is to be read in conjunction with the accompanying figures.

BRIEF DESCRIPTION OF THE DRAWINGS

FIG. 2A shows a plan view of a portion of an assembly in accordance with an illustrative embodiment of the invention, wherein the IC chip and the underfill are shown as a dashed outline.

FIG. 2B shows a sectional view of the FIG. 2A assembly.

DETAILED DESCRIPTION OF THE INVENTION

This invention will be illustrated herein in conjunction with exemplary assemblies comprising flip chips and circuit substrates. It should be understood, however, that the invention is not limited to the particular arrangements, materials and structures shown and described herein. Modifications to the illustrative embodiments will become apparent to those skilled in the art.

It should also be understood that the various elements shown in the accompanying figures are not drawn to scale. Moreover, for economy of description, the figures are restricted to only those regions of the exemplary assemblies that are required to show aspects of the invention. For example, in actual application, a circuit substrate in accordance with aspects of the invention will likely be more extensive than those circuit substrates illustrated herein. However, these more extensive circuit substrates will still come within the scope of the invention.

Figure 1A:
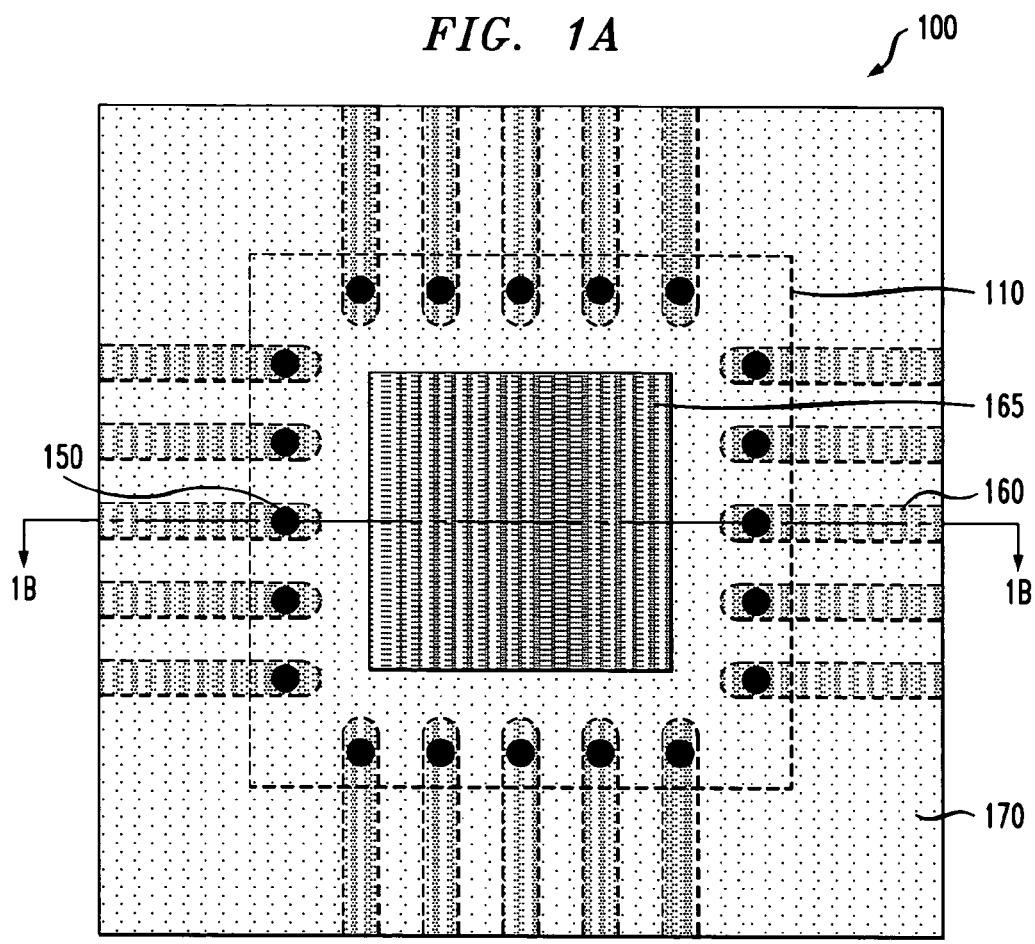
FIG. 1A shows a plan view of a portion of an assembly that can be improved by incorporating aspects of the invention, wherein the IC chip and the underfill are shown as a dashed outline.
Figure 1B:
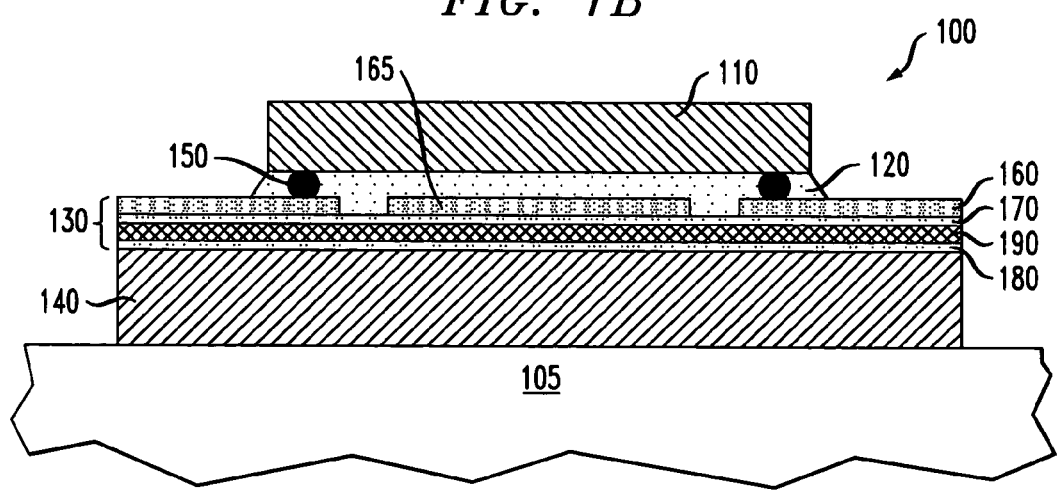
FIG. 1B shows a sectional view of the FIG. 1A assembly.

FIGS. 1A and 1B show an assembly 100 for use in FCoF applications that can be improved by incorporating aspects of the invention. FIG. 1A shows a plan view, while FIG. 1B shows a sectional view cut in a plane indicated in FIG. 1A. The assembly is attached to a support structure 105. The assembly comprises an IC chip 110, an underfill 120, a circuit substrate 130, a stiffener 140 and a plurality of solder bumps, represented by solder bump 150. The IC chip and the underfill are shown as a dashed outline in FIG. 1A to reveal the details of the underlying elements.

The circuit substrate 130, in turn, comprises numerous conductive traces, represented by conductive trace 160, which are attached to the solder bumps 150. Additionally, a conductive plate 165 is disposed between the conductive traces on the circuit substrate to aid in cooling the IC chip 110. The circuit substrate also comprises adhesive layers 170 and 180, as well as a polyimide layer 190. The polyimide layer gives the circuit substrate flexibility. However, in other embodiments, the circuit substrate need not be flexible. These other embodiment may be utilized in, for example, FCoB applications.

Electrical signals are transmitted between the IC chip 110 and the circuit substrate 130 through the solder bumps 150. The IC chip has its bond pads located proximate to one or more of its peripheral edges. The IC chip is therefore of a "peripheral I/O" type. Peripheral I/O IC chips are conventionally used in semiconductor technology and will be familiar to one skilled in that art.

Like most other types of IC chips, the IC chip 110 generates significant amounts of heat during its operation. To dissipate this heat, the stiffener 140 comprises a metallic material with a high thermal conductivity such as aluminum, silver, copper or gold. Heat transported to the stiffener, in turn, is transferred to the attached support structure 105. The support structure acts as a heat sink to dissipate the heat. The precise design of the support structure will depend on the particular application in which the assembly is utilized. However, it will typically comprise a metallic structure with a relatively large mass in comparison to the assembly.

Heat generated by the IC chip 110 is transferred to the stiffener 140 by some combination of the solder bumps 150, the underfill 120, and those elements forming the circuit substrate 130. As mentioned before, however, the heat flow from the IC chip to the stiffener is primarily through the underfill and the circuit substrate due to the placement of the solder bumps near the periphery of the IC chip and their relatively small dimensions. Accordingly, the total thermal resistance, $R_T$, for heat flow from the IC chip to the stiffener in the assembly 100 can be approximated by:

$$R_T = R_U + R_{CS},$$

where $R_U$ is the thermal resistance of the underfill and $R_{CS}$ is the thermal resistance of the circuit substrate. The above formula is obtained by recognizing that the underfill and circuit substrate effectively act in series with one another with respect to the path of heat flow.

FIGS. 2A and 2B, in contrast, show an illustrative embodiment of an assembly in accordance with aspects of the invention. FIG. 2A shows a plan view, while FIG. 2B shows a sectional view cut in a plane indicated in FIG. 2A. The assembly 200 is attached to a support structure 205 that acts as a heat sink for the assembly. Similarly to the assembly 100 shown in FIGS. 1A and 1B, the assembly 200 comprises an IC chip 210, an underfill 220, a circuit substrate 230 and a stiffener 240. As before, the IC chip and the underfill in FIG. 2A are shown as a dashed outline to reveal the details of the underlying elements.

Reference to FIGS. 2A and 2B shows that the IC chip 210 is attached to a plurality of signal solder bumps, represented by signal solder bump 250, that are arranged proximate to the periphery of the IC chip. The circuit substrate 230 comprises a plurality of conductive traces, represented by conductive trace 260, which are also attached to the signal solder bumps. The circuit substrate further comprises adhesive layers 270 and 280, as well as a polyimide layer 290.

In accordance with an aspect of the invention, the circuit substrate 230 only covers a portion of the stiffener 240, thereby defining an aperture over the stiffener. Moreover, the IC chip 210 comprises a multiplicity of thermal solder bumps, represented by thermal solder bump 300. The thermal solder bumps are substantially larger than the signal solder bumps 250. These thermal solder bumps pass through the aperture in the circuit substrate and come into physical contact with the exposed portion of the stiffener. The underfill 220, in turn, fills the remaining space between the IC chip, the circuit substrate and the stiffener.

In the assembly 200, the signal solder bumps 250 act as conduits for transferring electrical signals between the IC chip 210 and the circuit substrate 230. The thermal solder bumps 300, on the other hand, are not operative to transfer electrical signals but, instead, serve primarily to increase heat dissipation from the IC chip. The thermal solder bumps preferably have a thickness approximately equal to the height of the signal solder bumps, after attachment, and the total thickness of the circuit substrate. This thickness for the thermal solder bumps assures that the thermal solder bumps will make physical contact with the upper surface of the stiffener when the signal solder bumps are attached to the circuit substrate. Assuming, by way of example, that the height of the signal solder bumps after attachment (i.e., standoff height) is 40 micrometers and the total thickness of the circuit substrate is 100 micrometers, the standoff height of the thermal solder bumps would preferably be about 140 micrometers. Nevertheless, these dimensions are purely illustrative. Features with different dimensions would still come within the scope of the invention.

Advantageously, the assembly 200 in FIGS. 2A and 2B greatly enhances heat flow from the IC chip to the stiffener and the support structure (i.e., heat sink) relative to the assembly 100 shown in FIGS. 1A and 1B. This occurs in large part because the underfill 220, circuit substrate 230 and thermal solder bumps 300 act in parallel with one another with respect to the path of heat flow. Again, ignoring the contribution from the signal solder bumps 250 near the periphery of the IC chip 210, the total thermal resistance, $R_T$, from the IC chip to the stiffener 240 in the assembly 200 can be approximated by:

$$R_T = (1/R_U + 1/R_{TSB} + 1/R_{CS})^{-1}$$

where $R_U$ is the thermal resistance of the underfill, $R_{TSB}$ is the thermal resistance of the thermal solder bumps and $R_{CS}$ is the thermal resistance of the circuit substrate.

One skilled in the art will recognize that the thermal solder bumps 300, because of both their dimensions and metallic composition, will typically have a thermal resistance value that is substantially smaller than that of either the underfill 220 or the circuit substrate 230. For example, a typical solder composed of lead and tin that is utilized to form solder bumps has a thermal conductivity of about 51 (W/(m-K)). A polyimide material and conventional underfills, on the other hand, have thermal conductivities of about 0.15 and 0.25-1.1 (W/(m-K)), respectively (Source: C. Harper, editor, *Electronic Materials and Processes Handbook, Third Edition*, McGraw-Hill, 2003, incorporated herein by reference). Consequently, the thermal resistance of the thermal solder bumps, $R_{TSB}$, will dominate the right side of the equation immediately above, and the total thermal resistance, $R_T$, will tend to be slightly less than the thermal resistance of the thermal solder bumps alone, $R_{TSB}$.

As a result, the assembly 200 will be characterized by a substantially lower thermal resistance between the IC chip and the stiffener than that in the assembly 100, resulting in an enhanced rate of heat dissipation from the IC chip. Accordingly, by using an assembly in accordance with aspects of the invention, the IC chip 210 in the assembly 200 may be allowed to generate more heat without adversely affecting its lifetime.

Advantageously, formation of the thermal solder bumps 300 on the IC chip 210 can be accomplished at the same time as forming the signal solder bumps 250, thereby incurring little additional cost during fabrication. Solder bumps may be formed by processes including, but not limited to, evaporation, electroplating, printing, jetting, stud bumping and direct placement. One skilled in the art will recognize how these processes are accomplished and how these processes can be modified to produce solder bumps of varying dimensions. Moreover, these processes are described in a number of readily available references including, for example, M. Datta et al., *Microelectronic Packaging*, CRC Press, 2005, which is incorporated herein by reference. Solder bumps with diameters in excess of 150 micrometers are, as an example, conventionally manufactured in flip chip applications.

It is noted that the arrangement of the thermal solder bumps 300 in FIG. 2A is purely illustrative and other arrangements would still come within the scope of this invention. For example, the thermal solder bumps may optionally be arranged so that two or more thermal solder bumps are in physical contact with one another. Since the thermal solder bumps do not carry electrical signals, this physical contact will not have any adverse effects on the functionality of the IC chip 210. To the contrary, this arrangement may allow a greater number of thermal solder bumps to be bridged between the IC chip and stiffener 240, thereby further improving the heat dissipation from the IC chip.

Figure 2C:
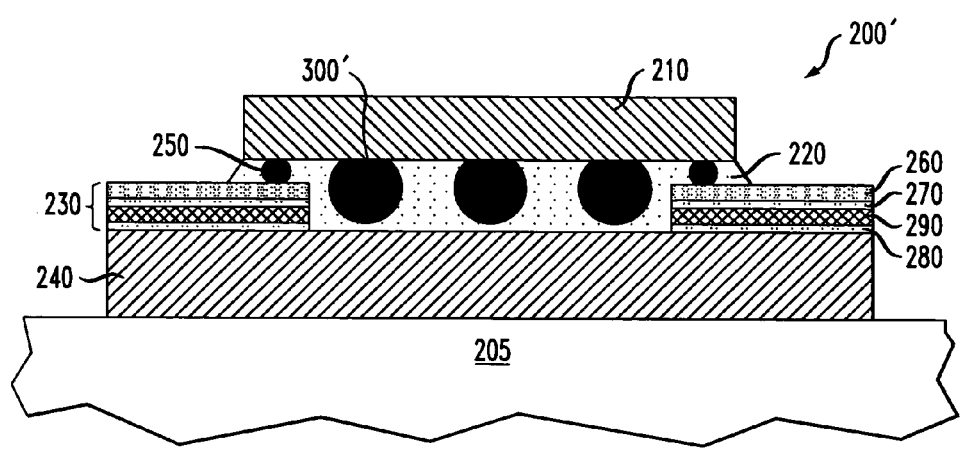
FIG. 2C shows a sectional view of the FIG. 2A assembly with non-contact thermal solder bumps.

Moreover, it should be noted that the thermal solder bumps 300 need not directly contact the stiffener 240 in order to see advantages from this invention. FIG. 2C illustrates this design option. The assembly 200' is identical to the assembly 200 shown in FIG. 2B except for the fact that "non-contact" thermal solder bumps 300' are utilized in place of the thermal solder bumps 300. The non-contact thermal solder bumps 300' are smaller than the thermal solder bumps 300 and, as a result, do not directly contact the stiffener 240. Consequently, regions of the underfill 220 lie between the non-contact thermal solder bumps and the stiffener. Owing in large part to the relatively high thermal resistance of these regions of the underfill, the total thermal resistance from the IC chip 210 to the stiffener in the assembly 200' is not as low as in the design incorporating the larger thermal solder bumps that make contact with the stiffener (i.e., assembly 200). Nevertheless, the total thermal resistance when utilizing the non-contact thermal solder bumps is still substantially lower than that in, for example, the assembly 100 shown in FIGS. 1A and 1B. The use of the non-contact thermal solder bumps 300' is therefore another effective way of reducing total thermal resistance for an assembly when compared to conventional designs. Non-contact thermal solder bumps may be useful in those cases where the dimensions of the thermal solder bumps are limited, for example, by processing constraints.

It is to be understood that, although illustrative embodiments of the present invention have been described herein with reference to the accompanying figures, the invention is not limited to those precise embodiments. For example, the arrangement, materials and structures forming a flip chip or circuit substrate may differ from those described in the illustrative embodiments and still come within the scope of the invention. One skilled in the art will recognize various other changes and modifications that may be made without departing from the scope of the appended claims.

What is claimed is:

1. An assembly comprising:
    a stiffener, the stiffener having a surface with a first region and a second region;
    a circuit substrate, the circuit substrate covering the first region;
    an integrated circuit chip, the integrated circuit chip overlying at least a portion of each of the first and second regions;
    a plurality of first solder bumps, the first solder bumps contacting the integrated circuit chip and the circuit substrate; and
    a plurality of second solder bumps, the second solder bumps being larger than the first solder bumps, contacting the integrated circuit chip and being disposed above the second region;
    wherein the circuit substrate has an aperture formed therethrough over the second region; and wherein the plurality of second solder bumps are arranged within the aperture in the form of an array of solder bumps.

2. The assembly of claim 1, wherein the second solder bumps contact the second region.

3. The assembly of claim 1, wherein the first solder bumps are operative to conduct electrical signals between the integrated circuit chip and the circuit substrate.

4. The assembly of claim 1, wherein the second solder bumps are operative to conduct heat from the integrated circuit chip to the stiffener.

5. The assembly of claim 1, wherein the second region is substantially square or is substantially rectangular.

6. The assembly of claim 1, wherein the first region substantially surrounds a periphery of the second region.

7. The assembly of claim 1, wherein the circuit substrate comprises a plurality of conductive traces.

8. The assembly of claim 7, wherein at least one of the first solder bumps is attached to at least one of the conductive traces.

9. The assembly of claim 1, wherein the second solder bumps have an average standoff height that is at least two times larger than an average standoff height of the first solder bumps.

10. The assembly of claim 1, wherein the second solder bumps have an average standoff height that is at least three times larger than an average standoff height of the first solder bumps.

11. The assembly of claim 1, wherein the first solder bumps are proximate to one or more peripheral edges of the integrated circuit chip.

12. The assembly of claim 1, further comprising an underfill, the underfill filling at least a portion of a space between the integrated circuit chip and the circuit substrate.

13. The assembly of claim 1, wherein the stiffener comprises a metal.

14. The assembly of claim 1, wherein the stiffener comprises aluminum, copper, gold or silver, or a combination of one or more thereof.

15. The assembly of claim 1, wherein the circuit substrate is substantially flexible.

16. The assembly of claim 1, wherein the circuit substrate is substantially rigid.

17. The assembly of claim 1, wherein two or more of the second solder bumps are in physical contact with one another.

18. The assembly of claim 1, wherein the second solder bumps comprise a solder having a thermal conductivity greater than about 30 Watts per meter-Kelvin (W/(m-K)).

19. An apparatus including:
an assembly, the assembly comprising:
    a stiffener, the stiffener having a surface with a first region and a second region;
    a circuit substrate, the circuit substrate covering the first region;
    an integrated circuit chip, the integrated circuit chip overlying at least a portion of each of the first and second regions;
    a plurality of first solder bumps, the first solder bumps contacting the integrated circuit chip and the circuit substrate;
    a plurality of second solder bumps, the second solder being larger than the first solder bumps and contacting the integrated circuit chip and the second region;
    wherein the circuit substrate has an aperture formed therethrough over the second region; and
    wherein the plurality of second solder bumps are arranged within the aperture in the form of an array of solder bumps; and
a support structure, the support structure attached to the stiffener and operative to dissipate heat generated by the integrated circuit chip.

20. A method of forming an assembly, the method comprising the steps of:
    forming a stiffener, the stiffener having a surface with a first region and a second region;
    forming a circuit substrate, the circuit substrate covering the first region;
    forming an integrated circuit chip, the integrated circuit chip overlying at least a portion of each of the first and second regions;
    forming a plurality of first solder bumps, the first solder bumps contacting the integrated circuit chip and the circuit substrate; and
    forming a plurality of second solder bumps, the second solder bumps being larger than the first solder bumps, contacting the integrated circuit chip and being disposed above the second region;
    wherein the circuit substrate has an aperture formed therethrough over the second region; and
    wherein the plurality of second solder bumps are arranged within the aperture in the form of an array of solder bumps.

* * * * *